United States Patent
Takase et al.

(10) Patent No.: US 8,711,258 B2
(45) Date of Patent: Apr. 29, 2014

(54) SOLID-STATE IMAGING DEVICE AND METHOD FOR MANUFACTURING THE SAME

(75) Inventors: Masayuki Takase, Osaka (JP); Motonari Katsuno, Kyoto (JP); Tetsuya Nakamura, Osaka (JP)

(73) Assignee: Panasonic Corporation, Osaka (JP)

( * ) Notice: Subject to any disclaimer, the term of this patent is extended or adjusted under 35 U.S.C. 154(b) by 29 days.

(21) Appl. No.: 13/428,024

(22) Filed: Mar. 23, 2012

(65) Prior Publication Data
US 2012/0268631 A1   Oct. 25, 2012

(30) Foreign Application Priority Data

Apr. 22, 2011 (JP) .................................. 2011-096168

(51) Int. Cl.
- *H04N 3/14* (2006.01)
- *H04N 5/225* (2006.01)
- *H01L 31/062* (2012.01)
- *H01L 27/00* (2006.01)

(52) U.S. Cl.
USPC ........... 348/294; 348/340; 348/273; 257/294; 438/69; 250/208.1

(58) Field of Classification Search
CPC ........ H04N 5/225; H04N 3/14; H01L 31/062; H01L 31/0232; H01L 21/00; H01L 27/00
USPC .......... 348/340, 294, 273; 257/291, 292, 436; 257/257, 432–435, 294; 250/208.1; 438/69–70
See application file for complete search history.

(56) References Cited

U.S. PATENT DOCUMENTS

| 8,139,131 B2* | 3/2012 | Komatsu et al. .............. 348/294 |
| 2006/0158547 A1 | 7/2006 | Komatsu et al. |
| 2007/0187787 A1* | 8/2007 | Ackerson et al. ............ 257/428 |
| 2008/0251697 A1* | 10/2008 | Park et al. .................. 250/208.1 |
| 2009/0189055 A1* | 7/2009 | Lin et al. .................... 250/208.1 |
| 2010/0060756 A1* | 3/2010 | Inuiya .......................... 348/280 |
| 2010/0245638 A1 | 9/2010 | Ota |

FOREIGN PATENT DOCUMENTS

| JP | 03-255404 | 11/1991 |
| JP | 03-282403 | 12/1991 |
| JP | 2006-295125 | 10/2006 |
| JP | 2010-067828 | 3/2010 |
| JP | 2010-232537 | 10/2010 |

* cited by examiner

*Primary Examiner* — Tuan Ho
*Assistant Examiner* — Marly Camargo
(74) *Attorney, Agent, or Firm* — Panasonic Patent Center

(57) ABSTRACT

A solid-state imaging device includes a semiconductor substrate having a plurality of light-receiving portions (PD) formed therein, a wiring layer formed on the semiconductor substrate, color filters formed on the wiring layer in a manner individually corresponding to the light-receiving portions (PD) of the semiconductor substrate, and partition walls each formed between the individual color filters. Each of the partition walls includes a lower layer portion and an upper layer portion, an upper surface of the lower layer portion is modified into a modified layer, and an interface for facilitating reflection of penetration light from outside is structured between the modified layer and the upper layer portion.

10 Claims, 8 Drawing Sheets

SOLID-STATE IMAGING DEVICE AND METHOD FOR MANUFACTURING THE SAME

BACKGROUND

1. Field of the Invention

The present invention relates to s solid-state imaging device and a method for manufacturing the same, and more particularly to a solid-state imaging device using partition walls between color filters and a method for manufacturing the same.

2. Description of the Related Art

A solid-state imaging device including color filters formed in a manner to correspond to individual light-receiving portions formed on a semiconductor substrate is known. A solid-state imaging device using partition walls between color filters is proposed as a technique to prevent light that is obliquely incident on a color filter from being incident on another adjacent color filter or adjacent light-receiving portion (see, for example, Unexamined Japanese Patent Publication No. H03-282403).

FIG. 8 is a cross sectional view of the solid-state imaging device described in Unexamined Japanese Patent Publication No. H03-282403.

Solid-state imaging device 900 described in Unexamined Japanese Patent Publication No. H03-282403 has a structure in which planarizing layer 903 is formed on light-receiving portions 901, and filters 907 to 910 formed above light-receiving portions 901 are separated from one another by organosilicon material layers. This means that partition walls 904, which are the organosilicon material layers, are disposed among filters 907 to 910 that correspond to individual light-receiving portions 901.

With this structure, light beams made incident obliquely on filters 907 to 910 are reflected by partition walls 904, or enter partition walls 904 and absorbed so that the light beams are prevented from reaching adjacent filters 907 to 910 or adjacent light-receiving portions 901.

SUMMARY

However, according to solid-state imaging device 900 described in Unexamined Japanese Patent Publication No. H03-282403, penetration light that has, for example, obliquely passed through partition wall 904 may enter adjacent filters 907 to 910 or adjacent light-receiving portions 901. It is noted that, if the penetration light enters light-receiving portion 901, a light signal which is not supposed to be detected is generated.

According to the present invention, a solid-state imaging device that can prevent light from penetrating through a partition wall and reaching a light-receiving portion, and a method for manufacturing the same are provided.

A solid-state imaging device according to the present invention includes a semiconductor substrate including a plurality of light-receiving portions formed therein, color filters individually formed on the light-receiving portions of the semiconductor substrate, and partition walls individually formed between the color filters. Each of the partition walls includes at least two layers and an interface that is positioned between the two layers and facilitates reflection of penetration light from outside.

Further, a method for manufacturing a solid-state imaging device includes a filter forming step forming, on a semiconductor substrate on which a plurality of light-receiving portions are formed, color filters individually on the light receiving portions, and a partition wall forming step forming partition walls on the semiconductor substrate between the light-receiving portions. In the partition wall forming step, a laminated film with at least two layers is formed.

According to the solid-state imaging device according to the present invention, since reflection of penetration light from outside propagating in the partition wall is facilitated by an interface, it is possible to prevent the penetration light from passing through the partition wall and reaching the adjacent light-receiving portion, and thereby suppress an occurrence of color mixture.

It is preferable that a refraction index of the layer adjacent to an upper side of the interface be higher than a refraction index of the layer adjacent to a lower side of the interface. Alternatively, it is preferable that a material of the layer adjacent to the upper side of the interface be different from a material of the layer adjacent to the lower side of the interface. It is further preferable that the layer adjacent to the lower side of the interface be formed by modifying a material which is the same material as that of the layer adjacent to the upper side of the interface.

It is preferable that the interface extend along the principal surface of the semiconductor substrate. Alternatively, it is preferable that the partition wall have a cross sectional shape in which a width thereof becomes smaller as it is distanced more from the semiconductor substrate in a vertical direction.

Further, it is preferable that a wiring layer is formed on a principal surface on a side of the semiconductor substrate on which the plurality of light-receiving portions are formed, the partition walls and the color filters are formed on a pixel region in which the plurality of light-receiving portions in the wiring layer are formed. It is preferable that an insulating film, wiring for a peripheral circuit, and a protective film are sequentially formed in this order on an outer periphery of the light-receiving portions in the wiring layer. And it is preferable that materials of at least the two layers of the partition walls be individually same as materials of the insulating film and the protective film.

In addition, according to a method for manufacturing a solid-state imaging device according to the present invention, since the partition wall is structured of a laminated film having at least two layers, an interface is provided between the layers of the laminated film. As a result, since reflection of penetration light from outside propagating in the partition wall is facilitated by the interface, it is possible to prevent the penetration light from passing through the partition wall and reaching an adjacent light-receiving portion, and thereby suppress an occurrence of color mixture.

Further, in the partition forming step, it is preferable that, after a film of a lower layer of the two layers is formed, a surface of the film be modified, and thereafter a film of an upper layer be formed. Alternatively, in the partition forming step, it is preferable that the film of the upper layer be formed of a material having a refraction index higher than a refraction index of the film of the lower layer.

DETAILED DESCRIPTION OF THE PREFERRED EMBODIMENT

Hereinafter, a solid-state imaging device and a method for manufacturing the same according to exemplary embodiments of the present invention will be described with reference to the drawings. It should be noted that the exemplary embodiments merely describe preferred examples of materials or values that are used in the present invention, and the invention is not restricted to such embodiments. It should be understood that various modifications and alterations may be possible without departing from the scope of the invention. Further, the exemplary embodiments may be combined with each other so long as such a combination remains consistent.

First Exemplary Embodiment

1. Overall Structure

Figure 1:
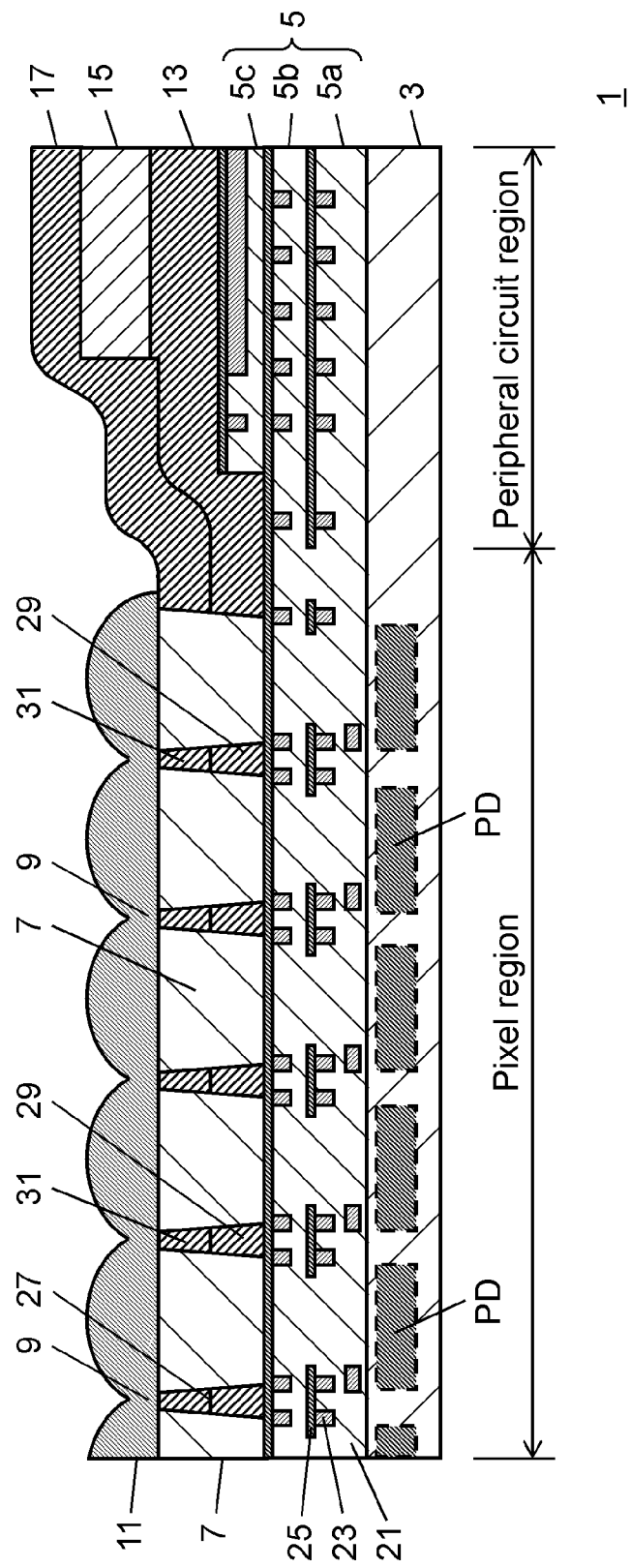
FIG. 1 shows a cross sectional view of a solid-state imaging device according to a first exemplary embodiment.

FIG. 1 is a cross sectional view of solid-state imaging device 1 according to a first exemplary embodiment.

As illustrated in FIG. 1, solid-state imaging device 1 includes a pixel region and a peripheral circuit region. In the pixel region, a plurality of pixel portions are formed in a two-dimensional shape. The peripheral circuit region is provided with circuits for outputting pixel signals from the pixel region to an external device and supplying power to each of the pixel portions.

Here, the plurality of pixel portions are formed in a matrix. The peripheral circuit region is provided in a partial area around the pixel region or in an entire area around the pixel region.

Semiconductor substrate 3 includes light-receiving portions in a two-dimensional shape in a manner individually corresponding to the pixel portions of the pixel region. Wiring layer 5 is formed on semiconductor substrate 3. Wiring layer 5 has a multilayer structure as will be described later.

In a pixel region on wiring layer 5, a plurality of color filters 7 are formed in a manner to individually correspond to the pixel portions, and partition walls 9 are formed between individual pixel portions. Microlens 11 is formed on color filter 7 and partition wall 9 in a manner corresponding to each of the pixel portions.

In the peripheral circuit region on wiring layer 5, interlayer dielectric film 13 is formed. A constituent component of the peripheral circuit is formed on interlayer dielectric film 13, and protective film 17 covering the constituent component is formed. Here, the constituent component is pad wiring 15.

2. Individual Structures (1) Semiconductor Substrate

For example, a silicon substrate is used as semiconductor substrate 3, and photocliodes PD which are light-receiving portions individually corresponding to the pixel portions are formed therein. If solid-state imaging device 1 is a CMOS type device, transfer transistors, reset transistors, amplifying transistors, or the like are further provided.

It is noted that, if the pixel portion is structured as n-pixel, 1-unit cell configuration (where n is a natural number), each of the pixel portions has n photodiodes PD, n transfer transistors, one reset transistor, and one amplifying transistor.

Photodiode PD accumulates therein charges obtained by photoelectric conversion in accordance with received light. The transfer transistor transfers the charges accumulated in photodiode PD to a charge accumulation portion (floating diffusion) according to a transfer control signal. The reset transistor initializes the charge accumulation portion according to a reset signal. The amplifying transistor outputs a signal according to a level of charges accumulated in the charge accumulation portion.

(2) Wiring Layer

Wiring layer 5 includes wiring for electrically connecting each of the pixel portions and the peripheral circuit together. Wiring layer 5 in the pixel region has a double-layer structure with first layer 5a and second layer 5b. Wiring layer 5 in the peripheral circuit region has a triple-layer structure with first layer 5a, second layer 5b, and third layer 5c. It is noted that a layer closest to semiconductor substrate 3 is first layer 5a. It is needless to say that the wiring layer may be a single layer, or may have the same number of layers both in the pixel region and the peripheral circuit region.

Individual layers 5a, 5b, and 5c have, for example, insulating film 21 and wiring 23 in insulating film 21, and diffusion preventing film 25 for wiring 23 if necessary. Wiring 23 is metallic wiring. Therefore, wiring is formed between adjacent photodiodes PD so that light incident on the photodiode is not blocked.

(3) Color Filter

Color filter 7 is selected according to a wavelength of light incident on photodiode PD. Color filter 7 is formed in an island shape (formed in a manner corresponding to each of the pixel portions). This means that color filters 7 are in an isolate independent state separated from adjacent color filters 7.

Color filter 7 is formed to have a shape in cross section such that a side of semiconductor substrate 3 is narrower, and a side of microlens 11 is wider. To state it differently, in the cross sectional view illustrated in FIG. 1, a width of color filter 7 becomes smaller toward the side of semiconductor substrate 3.

In this way, the cross sectional shape of color filter 7 is an inverted trapezoidal shape. This means that it is in a shape of a small trapezoid having a width of a lower base thereof on the side of semiconductor substrate 3 being smaller than a width of an upper base thereof on the side of microlens 11.

(4) Partition Wall

Partition walls 9 prevent light incident from microlens 11 or color filter 7 from entering an adjacent pixel portion.

Partition walls 9 have a grid shape (mesh pattern) in plan view having openings in portions corresponding to color filters 7. According to the cross sectional view illustrated in FIG. 1, individual partition walls 9 are viewed as if they were independent.

The cross sectional shape of partition wall 9 in this exemplary embodiment is a trapezoid as a whole. The trapezoidal shape here means a shape having a lower base on the side of semiconductor substrate 3 longer than an upper base on the side of microlens 11. In other words, it is in a shape of which a width becomes smaller as it is distanced more from semiconductor substrate 3.

Partition wall 9 is formed of a material having a refraction index lower than that of color filter 7. For this reason, light propagating obliquely through color filter 7 is reflected when it reaches a surface of partition wall 9. In such a case, since partition wall 9 has a shape of which a width becomes smaller as it is distanced more from semiconductor substrate 3, the reflected light propagates toward photodiode PD.

Partition wall 9 is formed of three layers and has therein interface 27 parallel to a principal surface of semiconductor substrate 3. To state it differently, partition wall 9 has a laminated structure having lower layer portion 29 and upper layer portion 31 with interface 27 interposed therebetween. With this structure, it is possible to obtain a reflection characteristic which is uniform regardless of a direction of light incident on partition wall 9. To be specific, penetration light beams incident from the sides of color filters 7 adjacent on both the right and left sides of partition wall 9 at angles identical with each other with respect to the interface are reflected toward the microlens at an identical reflection angle.

Interface 27 is formed at a position at about half a height (thickness) of partition wall 9, lower layer portion 29 and upper layer portion 31 similarly have a trapezoidal shape which is a shape having a width that becomes smaller as it is distanced more from semiconductor substrate 3.

Interface 27 can be obtained, for example, by a film modification technique applied to an upper surface of lower layer portion 29. A method of manufacturing partition wall 9 or the like will be described later. The film modification is a modification in an optical characteristic, and the modified portion is dealt with as a single layer. As a result, lower layer portion 29 includes a modified layer resulted from the layer modification and a residual layer that remains unmodified, and interface 27 is located between the modified layer and upper layer portion 31.

With this modification, when penetration light propagating through upper layer portion 31 toward lower layer portion 29 reaches interface 27, the light is reflected and propagates toward microlens 11.

In this way, since the penetration light that enters partition wall 9 and is about to penetrate through an adjacent pixel is reflected by interface 27, it is possible to prevent the penetration light propagating through partition wall 9 from further penetrating, and reduce color mixture as a result.

(5) Microlens

Microlens 11 collects light incident from above onto photocliode PD of a corresponding pixel portion.

Microlens 11, in this exemplary embodiment, is a convex lens protruding in a direction away from semiconductor substrate 3. Here, microlens 11 is an integrated form including a lens portion laid on photodiode PD and a connection portion connecting individual lens portions on partition walls 9. The microlens serves its function if a portion having a light collecting function (lens portion) is formed on color filter 7 or the pixel portion, and the lens portion may be structured in an isolated manner.

3. Exemplary Embodiments

(1) Semiconductor Substrate and Wiring Layer

Semiconductor substrate 3 and wiring layer 5 have the same structure as the conventional ones, and therefore will be described briefly.

As semiconductor substrate 3, for example, a silicon substrate is used.

In wiring layer 5, for example, oxide silicon which is an insulating material can be used as insulating film 21. For example, copper can be used as wiring 23. For example, silicon carbide can be used as diffusion preventing film 25 to prevent copper atoms from diffusing from wiring 23 using copper into insulating film 21.

The plurality of photodiodes PD formed on semiconductor substrate 3 have spacing of 1.8 μm or less from one another and a cell size of 1.4 μm.

(2) Interlayer Dielectric Film, Pad Wiring, and Protective Film

Interlayer dielectric film 13 is, for example, a silicon oxide film, and a film thickness thereof is 200 nm to 400 nm. Pad wiring 15 is made of, for example, aluminum, and a film thickness thereof is 300 nm to 800 nm. Protective film 17 is, for example, a silicon oxide film, and a film thickness thereof is 300 nm to 500 nm.

(3) Color Filter

Color filters 7 include three types, namely, red (R), green (G), and blue (B), and are arranged in a Bayer pattern. Color filter 7 of each color is formed of an organic material (for example, acrylic resin) in which pigments of each color are mixed. In this case, the refraction index of color filter 7 is 1.5 to 1.7. Further, a film thickness of color filter 7 is 300 nm to 700 nm.

(4) Partition Wall

In this case, partition wall 9 has a double layer structure of silicon oxide films. Specifically, lower layer portion 29 and upper layer portion 31 are silicon oxide films, a height as partition wall 9 is 500 nm to 700 nm, and a width thereof is 50 nm to 200 nm. Note that partition wall 9 has a trapezoidal shape in cross section with a lower base (on the side of semiconductor substrate 3) having a width of 100 nm to 350 nm and an upper base (on the side of microlens 11) with a width of 50 nm to 200 nm.

Interface 27 is formed near a center in a height direction of partition wall 9. For example, the height of partition wall 9 is 500 nm to 700 nm as described above, and it is preferable that interface 27 be provided at a position distanced from a top surface of partition wall 9 by 200 nm to 500 nm when the top surface serves as a reference.

This is because light is collected once by microlens 11 toward each color filter 7, an amount of light component passing through a portion close to the upper surface of partition wall 9 is small, and therefore arranging interface 27 on an upper side of partition wall 9 provides a small effect. In contrast, since a light component that has passed through a portion close to a bottom surface of partition wall 9 is partially shielded by wiring layer 5 formed below partition wall 9, arranging the interface on a lower side of partition wall 9 also provides a small effect. For these reasons, it is preferable that interface 27 be provided near the center in a height direction of partition wall 9.

4. Manufacturing Method

FIG. 2A to FIG. 4B are cross sectional views for describing a method for manufacturing solid-state imaging device 1 according to this exemplary embodiment. The description that will be given here relates to a method for manufacturing solid-state imaging device 1 which is described in the above-mentioned exemplary embodiment and is one example of the method for manufacturing according to the present invention.

Figure 2A:
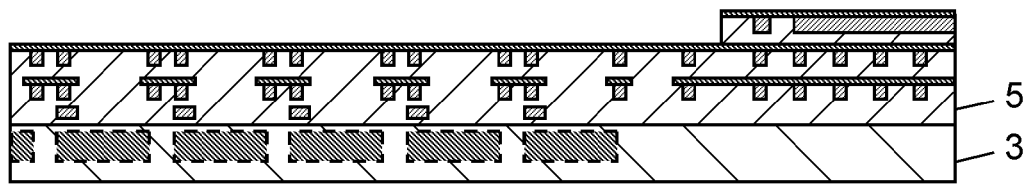
FIG. 2A shows a cross sectional view for describing a method for manufacturing the solid-state imaging device according to the first exemplary embodiment.

(a) As illustrated in FIG. 2A, wiring layer 5 is laminated (formed) on an upper surface of semiconductor substrate 3 in which a plurality of photodiodes or the like are formed on silicon substrates or the like.

Figure 2B:
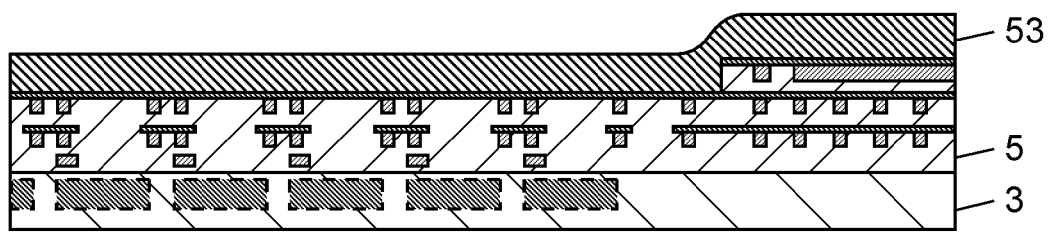
FIG. 2B shows a cross sectional view for describing a method for manufacturing the solid-state imaging device according to the first exemplary embodiment.

(b) As illustrated in FIG. 2B, interlayer dielectric film 53 is formed on a substantially entire surface of wiring layer 5.

Specifically, a silicon oxide film (TEOS film) is deposited by plasma CVD (Chemical Vapor Deposition) method using TEOS (Tetra Ethyl Ortho Silicate) as a material. Interlayer dielectric film 53 is formed to have a film thickness of, for example, 200 nm to 400 nm considering a withstand voltage between wiring layer 5 and pad wiring 15. Interlayer dielectric film 53 corresponds to lower layer portion 29 that forms partition wall 9.

Figure 2C:
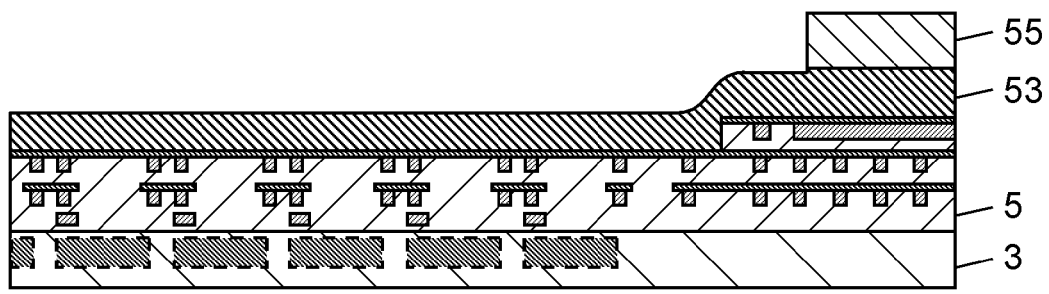
FIG. 2C shows a cross sectional view for describing a method for manufacturing the solid-state imaging device according to the first exemplary embodiment.

(c) As illustrated in FIG. 2C, metallic film 55 for pad wiring 15 is formed in a predetermined portion corresponding to the peripheral circuit region on interlayer dielectric film 53.

Specifically, metal including aluminum or the like is formed in a film form on an upper surface of interlayer dielectric film 53 by, for example, sputtering method. Then, a resist pattern corresponding to pad wiring 15 is formed on metallic film 55 thus formed by a lithography technique, and metallic film 55 is arranged in a predetermined shape by anisotropic etching such as, for example, plasma etching to thereby form pad wiring 15.

During this process, in a portion of upper surface of interlayer dielectric film 53 in a region (pixel region) where pad wiring 15 is not formed, a layer (modified layer of lower layer portion 29) whose property is altered by the plasma processing and having a different refraction index is formed. A surface thereof, thereafter, serves as interface 27 between upper layer portion 31 and lower layer portion 29 of partition wall 9.

Figure 3A:
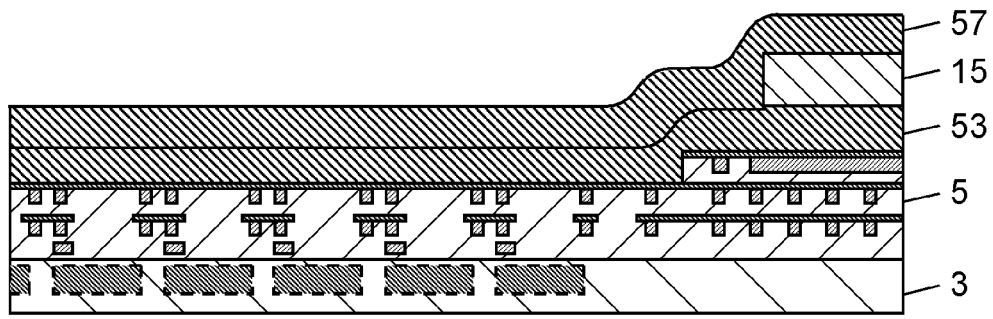
FIG. 3A shows a cross sectional view for describing a method for manufacturing the solid-state imaging device according to the first exemplary embodiment.

(d) As illustrated in FIG. 3A, protective film 57 for protecting pad wiring 15 is formed.

Specifically, a silicon oxide film (TEOS film) is deposited by plasma CVD method using TEOS as a material.

Here, a film thickness of protective film 57 is 300 nm to 500 nm. By forming protective film 57 on pad wiring 15, a surface leakage of pad wiring 15 can be prevented. Protective film 57 corresponds to upper layer portion 31 that forms partition wall 9.

(e) Interlayer dielectric film 53 and protective film 57 on the pixel portions are removed.

Figure 3B:
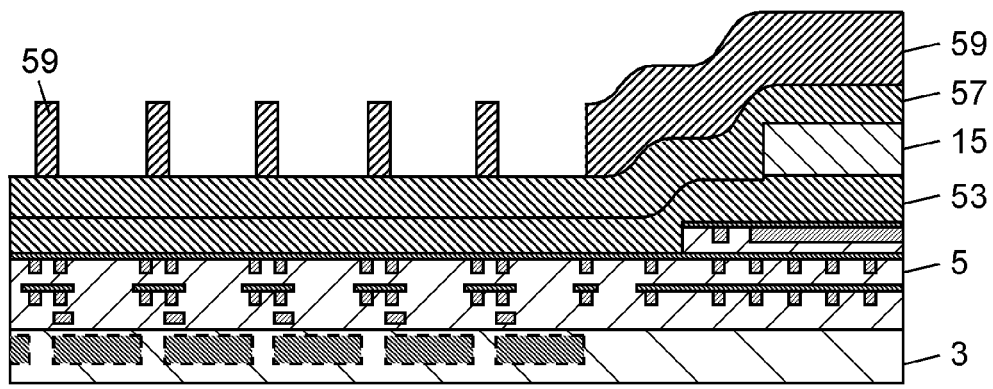
FIG. 3B shows a cross sectional view for describing a method for manufacturing the solid-state imaging device according to the first exemplary embodiment.
Figure 3C:
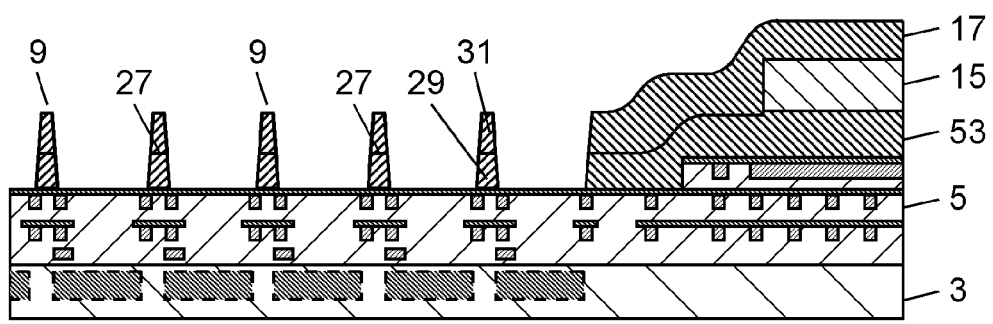
FIG. 3C shows a cross sectional view for describing a method for manufacturing the solid-state imaging device according to the first exemplary embodiment.

Specifically, as illustrated in FIG. 3B, a pattern of resist 59 having openings corresponding to upper portions of the pixel portions is formed on protective film 57. Subsequently, as illustrated in FIG. 3C, interlayer dielectric film 53 and protective film 57 are etched using resist 59 as a mask to remove interlayer dielectric film 53 and protective film 57 on the pixel portions. Finally, resist 59 is removed. With this arrangement, partition walls 9 are formed between and on the pixel portions. As a result, interlayer dielectric film 13, pad wiring 15, and protective film 17 are formed.

Figure 4A:
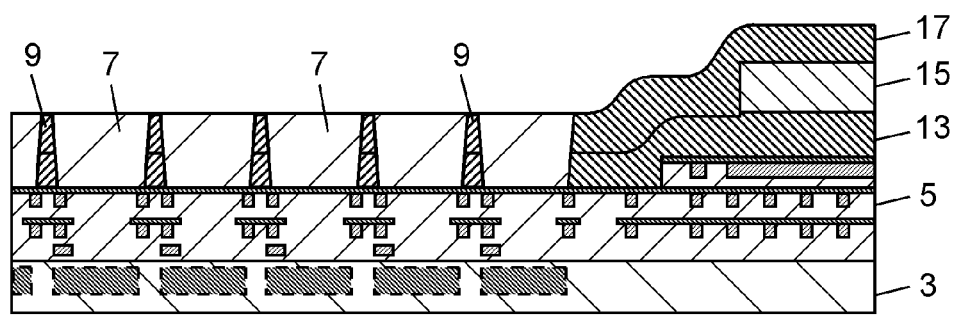
FIG. 4A shows a cross sectional view for describing a method for manufacturing the solid-state imaging device according to the first exemplary embodiment.

(f) As illustrated in FIG. 4f, color filters 7 each having predetermined primary colors are formed in regions delimited by partition walls 9. Specifically, acrylic resins containing pigments are filled in recesses delimited by partition walls 9.

Figure 4B:
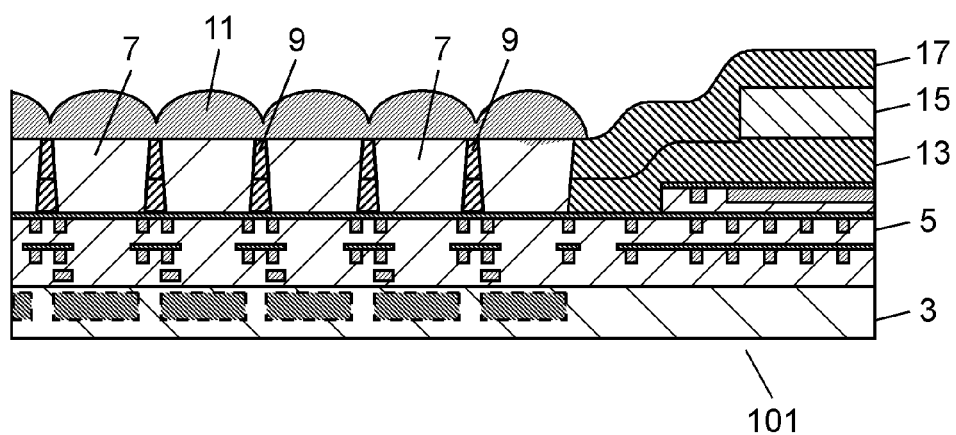
FIG. 4B shows a cross sectional view for describing a method for manufacturing the solid-state imaging device according to the first exemplary embodiment.

(g) As illustrated in FIG. 4B, finally, microlenses 11 are formed on upper surfaces of color filters 7 and partition walls 9. By this process, solid-state imaging device 1 described in the above-mentioned exemplary embodiment is manufactured.

According to the above-mentioned manufacturing method, interlayer dielectric film 13 (53) and protective film 17 (57) that are formed in the peripheral circuit region on semiconductor substrate 3 are used as materials for forming partition walls 9. Accordingly, partition walls 9 can be formed in the same process as the process for forming interlayer dielectric film 13 and protective film 17. For this reason, there is no need to specifically provide a process for forming partition walls 9, and therefore the process can be simplified.

Further, in the case where interlayer dielectric film 13 and protective film 17 are formed of the same material, since pad wiring 15 is formed after metallic film 55 for pad wiring 15 is formed on interlayer dielectric film 13, the surface of interlayer dielectric film 53 located in the pixel region is modified by performing etching on metallic film 55. In this way, formation of partition walls 9 and interfaces 27 and formation of pad wiring 15 can be performed in the same process. Accordingly, there is no need to specifically provide a process for forming interfaces 27, and therefore the process can be simplified.

Second Exemplary Embodiment

In the first exemplary embodiment, wiring layer 5 is arranged above photodiodes PD of semiconductor substrate 3. In contrast, in order to increase a light propagation efficiency of light incident on the microlens into the photodiode, it may be structured in such a way that a light waveguide including a core portion formed of a material having a refraction index higher than that of the interlayer dielectric film of the wiring layer is provided in a portion in the wiring layer above the photodiodes.

Hereinafter, a description will be given of solid-state imaging device 101 provided with light waveguide 119 as a second exemplary embodiment.

Figure 5:
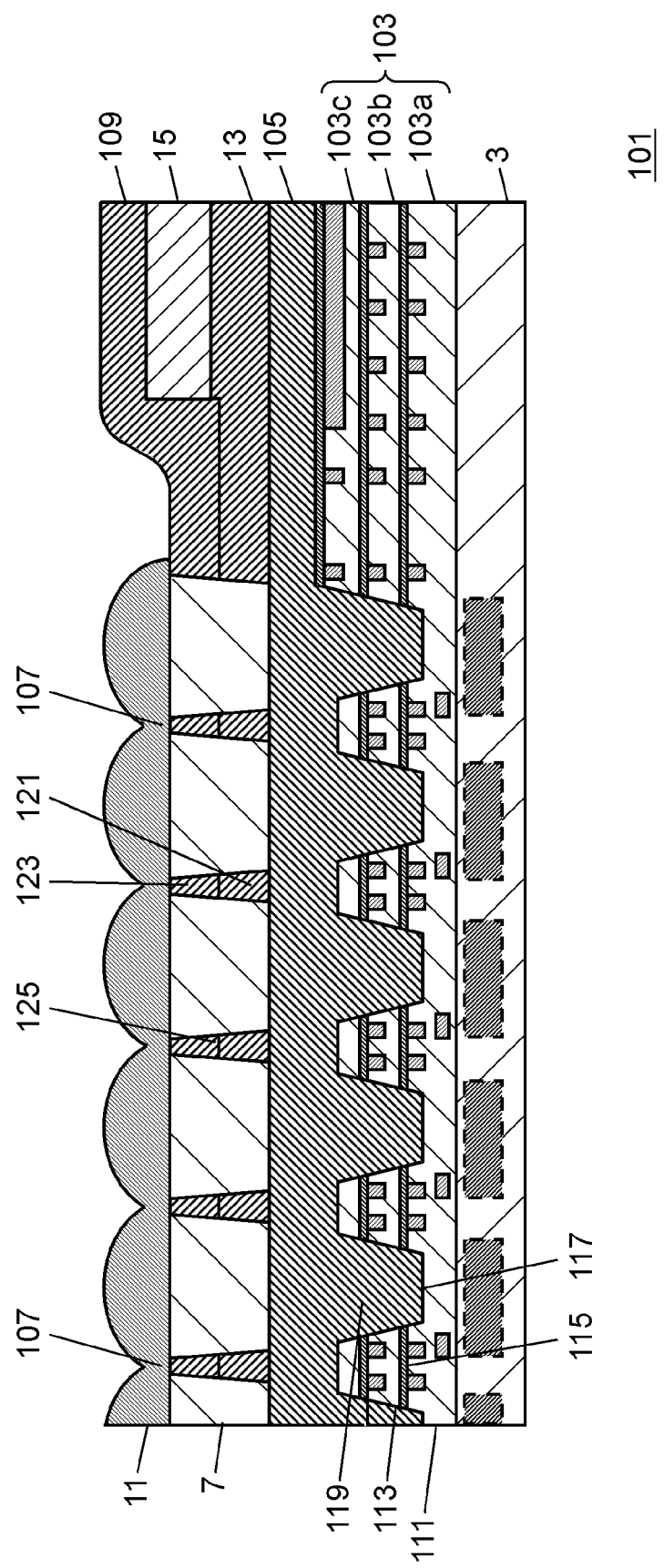
FIG. 5 shows a cross sectional view of a solid-state imaging device according to a second exemplary embodiment.

FIG. 5 is a cross sectional view of solid-state imaging device 101 according to the second exemplary embodiment.

As illustrated in FIG. 5, solid-state imaging device 101 includes semiconductor substrate 3, wiring layer 103, insulating film 105, color filter 7, partition wall 107, microlens 11, interlayer dielectric film 13, pad wiring 15, protective film 109, and the like.

Here, the semiconductor substrate, the color filter, the interlayer dielectric film, and the pad wiring have the same structures as semiconductor substrate 3, color filter 7, interlayer dielectric film 13, and pad wiring 15, respectively, which are described in the first exemplary embodiment, and therefore the descriptions thereof will not be repeated. Insulating film 105 is referred to as high-refraction insulating film 105 to distinguish it from insulating film 111 of wiring layer 103 which will be described later.

As in the case of the first exemplary embodiment, wiring layer 103 has a double-layer structure with first layer 103a and second layer 103b in the pixel region, and has a triple-layer structure with first layer 103a, second layer 103b, and third layer 103c in the peripheral circuit region.

As in the case of the first exemplary embodiment, individual layers 103a, 103b, and 103c include insulating film 111, wiring 113 in insulating film 111, and diffusion preventing film 115 for wiring 113.

Wiring layer 103 located on semiconductor substrate 3 in the pixel region has recess portions 117 corresponding to photodiodes PD, and an insulating material which is high-refraction insulating film 105 is filled in recess portions 117.

High-refraction insulating film 105 which is not included in the structure according to the first exemplary embodiment is formed on a surface of wiring layer 103. This means that high-refraction insulating film 105 is formed on an upper surface of wiring layer 103 and in recess portions 117. An upper surface (color filter side) of high-refraction film 105 is planarized.

High-refraction insulating film 105 has a refraction index higher than that of insulating film (insulating material) 111 constituting wiring layer 103.

Here, for example, insulating film 111 of wiring layer 103 is formed of silicon oxide, and high-refraction insulating film 105 is formed of silicon oxynitride, silicone nitride, or the like. The refraction index of silicon oxide is 1.4 to 1.5, that of silicon oxynitride is 1.6. to 1.8, and that of silicon nitride is 1.9 to 2.0.

As described above, by using high-refraction insulating film 105 having a refraction index higher than that of wiring layer 103, high-refraction insulating film 105 has a function as light waveguide 119 for guiding light that has penetrated color filter 7 to photodiode PD.

Color filters 7 are individually provided on photodiodes PD on an upper surface of high-refraction insulating film 105, and partition walls 107 are formed between adjacent color filters 7. As in the case of the first exemplary embodiment, interlayer dielectric film 13, pad wiring 15, and protective film 109 are formed on the peripheral circuit region.

Partition wall 107 has a double-layer structure with lower layer portion 121 and upper layer portion 123. Here, lower layer portion 121 and upper layer portion 123 are individually formed of different materials, and, as a result of this arrangement, interface 125 is formed between lower layer portion 121 and upper layer portion 123 due to the difference of materials.

Lower layer portion 121 is obtained, for example, by utilizing formation of interlayer dielectric film 13 and is formed of a silicon oxide film as in the case of interlayer dielectric film 13. Upper layer portion 123 is obtained, for example, by utilizing formation of protective film 109 and is formed of a silicon oxynitride film.

Lower layer portion 121 and upper layer portion 123 individually use different materials, and, as described above, the silicon oxynitride film forming upper layer portion 123 is higher than the silicon oxide film in refraction index. With this arrangement, penetration light propagating in upper layer portion 123 toward lower layer portion 121 can be reflected toward a side of microlens 11 by interface 125 so that the color mixture can be prevented.

It is noted that, in the second exemplary embodiment, microlenses 11 are also formed on an upper surface of color filters 7 and partition walls 107 in a manner corresponding to individual pixel portions.

One example of a method for manufacturing solid-state imaging device 101 according to the second exemplary embodiment will be described.

The method for manufacturing solid-state imaging device 101 include a substrate forming process for forming semiconductor substrate 3 and a wiring layer forming process for forming wiring layer (wiring layer with recess portions 117 formed therein) 103 on semiconductor substrate 3. The method also includes a high-refraction insulating film forming process for forming high-refraction insulating film 105 on wiring layer 103, and a first oxide film forming process for forming an oxide film (silicon oxide film) for interlayer dielectric film 13 on high-refraction insulating film 105. The method also includes a metallic film forming process for forming a metallic film for pad wiring 15 on the silicon oxide film formed by the first oxide film forming process, and a first removing process for removing portions of the metallic film other than those corresponding to pad wiring 15. The method also includes a second oxide film forming process for forming a silicon oxide film for protective film 109 on a region from which an unnecessary metallic film is removed in the first removing process and on a region where the metallic film is present, and a second removing process for removing a portion, corresponding to the pixel region, of the silicon oxide film formed by the second oxide film forming process. The method also includes an oxynitride film forming process for forming a silicon oxynitride film for upper layer portions 123 of partition walls 107, a third removing process for removing portions of the silicon oxynitride film other than those corresponding to the upper layer portions, a color filter forming process for forming color filters 7 in the recess portions formed by partition walls, and a lens forming process for forming microlenses 11 on partition walls 107 and color filters 7.

In this exemplary embodiment, for example, a same material is used for lower layer portion 121 of partition wall 107 having a double-layer structure and interlayer dielectric film 13, and a same material is used for upper layer portion 123 and protective film 109. Therefore, these can be formed in a simple manner by utilizing the formation of interlayer dielectric film 13 and protective film 109.

Further, using different materials to individually form upper layer portion 123 and lower layer portion 121 makes it possible to form interface 125 easily.

Third Exemplary Embodiment

In the first and second exemplary embodiments, partition wall 9 or 107 is in intimate contact with color filter 7. However, this may be structured in such a way that an adhesion layer is arranged between the partition wall and the color filter, or alternatively the color filter may be in a shape different from that in the first exemplary embodiment.

Figure 6:
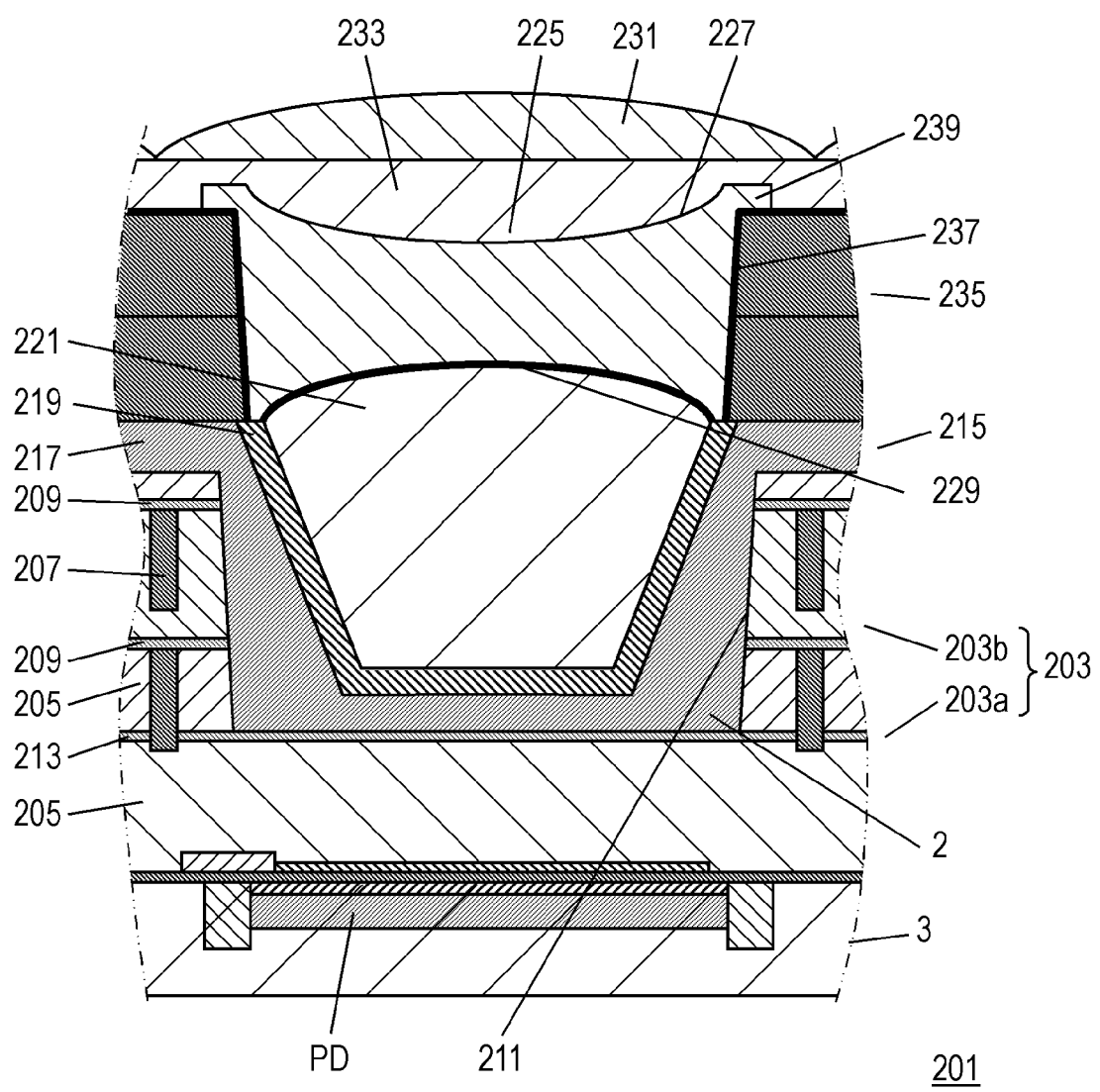
FIG. 6 shows an enlarged view of one pixel portion of a solid-state imaging device according to a third exemplary embodiment.

FIG. 6 is an enlarged view of one pixel portion of solid-state imaging device 201 according to the third exemplary embodiment.

Solid-state imaging device 201 includes wiring layer 203 on semiconductor substrate 3. Wiring layer 203 has a double-layer structure with first layer 203a and second layer 203b, and each of layers 203a and 203b includes insulating film 205, wiring 207, and diffusion preventing film 209. Recess portion 211 for a light waveguide is formed on photodiode PD in wiring layer 203.

Note that a film (213) serving as a reference when recess portion 211 is formed in wiring layer 203 at a portion corresponding to a bottom of recess 211. Specifically, etch stop film 213 for restricting the etching when recess portions 211 are formed by etching. For example, a silicon carbide film or a silicone nitride film can be used as the etch stop film.

Insulating layer 215 is formed in recess portion 211 of wiring layer 203. Insulating layer 215 has a layer structure with a plurality of layers. Specifically, insulating layer 215 has first insulating film 217 formed to cover a surface of wiring layer 203, and a bottom surface and a side surface that form recess portion 211. Insulating layer 215 also has second insulating film 219 formed on an upper surface of first insulating film 217 in recess portion 211. Insulating layer 215 also has third insulating portion 221 disposed inside recess portion 211 where first and second insulating films 217 and 219 are formed.

As for refraction indices of first insulating film 217, second insulating film 219, and third insulating portion 221, second insulating film 219 is lower than that of first insulating film 217 in refraction index, and third insulating film 221 is higher than that of second insulating film 219 in refraction index.

With this arrangement, light incident on second insulating film 219 from third insulating portion 221 propagates in first insulating film 217 due to the relation between refraction indices of first insulating film 217 and second insulating film 219 and exits from the side of photodiode PD.

Color filter 225 arranged on photodiode PD has upper surface 227 which is depressed toward a side of semiconductor substrate 3, and lower surface 229 which is depressed toward a side of microlens 231. To state it differently, color filter 225 has a shape of a concave lens. With this arrangement, light that has been refracted by microlens 231 is refracted by color filter 225 so that the light propagates further toward photodiode PD.

Third insulating portion 221 has a shape that protrudes toward a side of microlens 231 along a convex shape of lower surface 229 of color filter 225. Further, upper surface 227 of color filter 225 has planarized film 233 formed thereon for planarization purpose.

Adhesion layer 237 is formed between partition wall 235 and color filter 225, and between third insulating portion 221 of insulating layer 215 and color filter 225 for improving adhesion therebetween. Particularly, if partition wall 235 and insulating layer 215 (third insulating portion 221 in particular) are formed of an inorganic material, and color filter 225 is formed of an organic material having a weak binding force with the inorganic material, the binding force between the inorganic material and the organic material is weak. For this reason, it may be possible that color filter 225 peels off from partition wall 235. However, by using an organic material having a high binding force with an inorganic material as the adhesion layer, it is possible to increase the binding force between partition wall 235 and color filter 225 and the binding force between insulating layer 215 and color filter 225. As a material for adhesion layer 237, specifically, an epoxy resin, an acrylic resin, a urethane resin, or the like can be named.

Further, color filter 225 juts out (jutting-out portion 239) on an upper surface of partition wall 235 while keeping a distance from other adjacent color filters 225 on the upper surface of partition wall 235, enlarging a binding area between color filter 225 and partition wall 235.

Fourth Exemplary Embodiment

In the first to third exemplary embodiments, although the solid-state imaging device according to the present invention is of a front side illumination (FSI) type, it may be of a back side illumination (BSI) type. It is noted that a side on which light enters is referred to as a front side.

Figure 7:
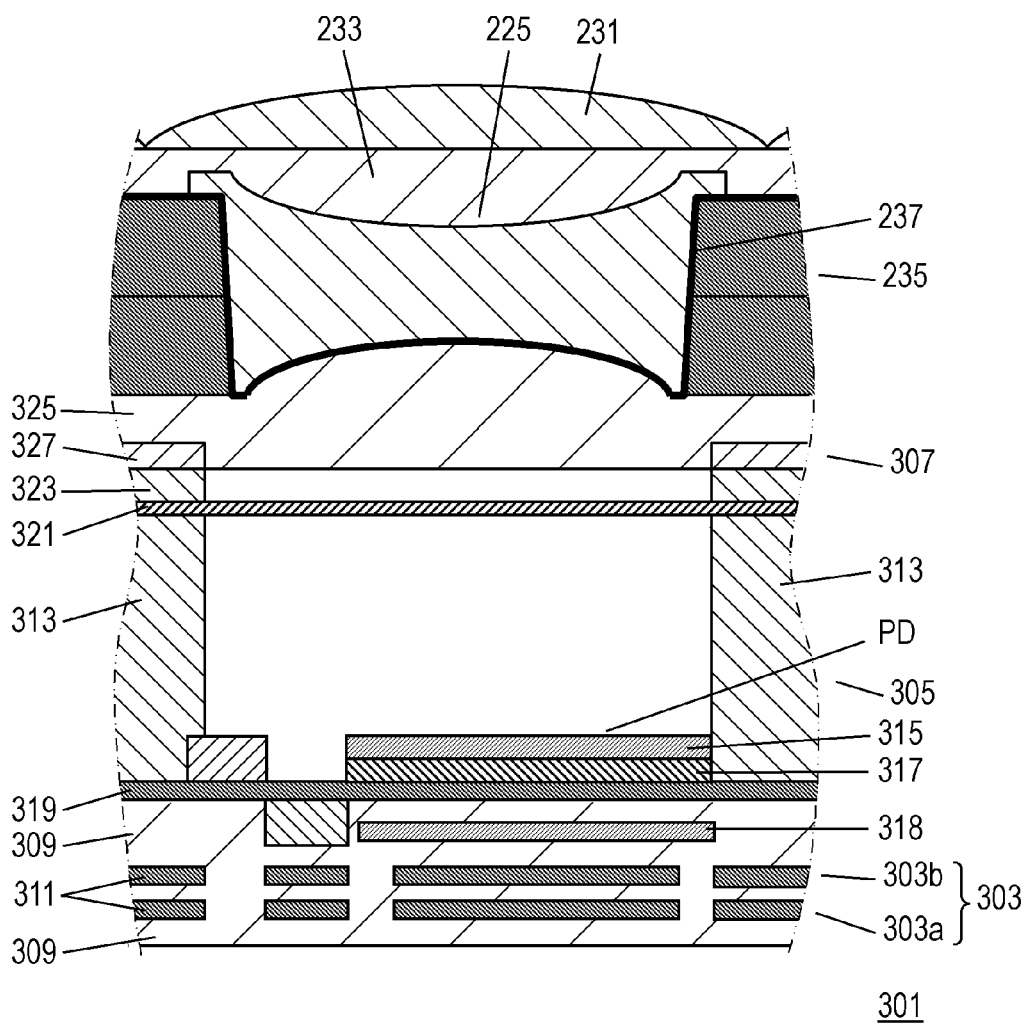
FIG. 7 shows an enlarged view of one pixel portion of a solid-state imaging device according to a fourth exemplary embodiment.
Figure 8:
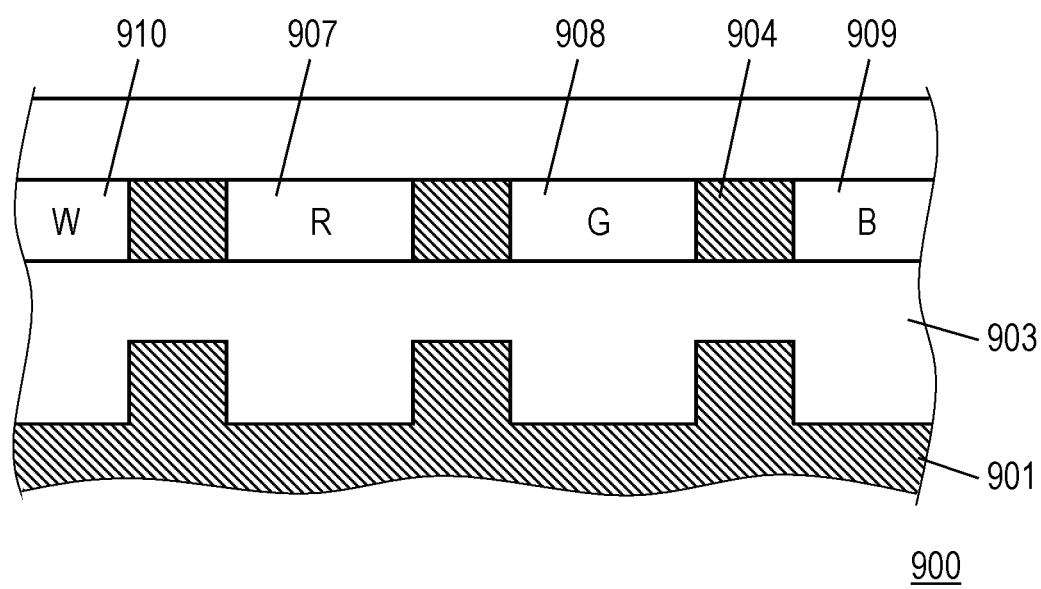
FIG. 8 shows a cross sectional view of a solid-state imaging device disclosed in Unexamined Japanese Patent Publication No. H03-282403.

FIG. 7 is an enlarged view of one pixel portion of solid-state imaging device 301 according to the fourth exemplary embodiment.

Solid-state imaging device 301 includes wiring layer 303, semiconductor layer (semiconductor substrate) 305, insulating layer 307 in addition to color filters 225, microlenses 231, planarized film 233, partition walls 235, and adhesion layer 237 as described in the third exemplary embodiment.

As illustrated in FIG. 7, wiring layer 303 is formed on a rear side of semiconductor layer 305, and has a multilayer structure (here, it is a double-layer structure). Each of layers 303a and 303b has insulating film 309 and wiring 311.

Semiconductor layer 305 has, for example, pixel segment region 313 corresponding to each of the pixel portions in the silicon layer (silicon substrate), and photodiode PD is formed on a side of wiring layer 303 in a region segmented by pixel segment region 313. Specifically, P-region n-type well region 315 and P+ region 317 are formed.

Gate insulating film 319 is formed on a rear side of photodiode PD, and P+ region 321 for preventing white defects from being caused is formed on a front side of semiconductor layer 305.

Reflection film 318 for reflecting light that has penetrated through photodiode PD back again toward photodiode PD is formed in a region corresponding to a rear side of photodiode PD of wiring layer 303.

Reflection film 318 may be formed of the same material as that used for wiring 311 or another material.

Insulating layer 307 has a multilayer structure (here, it is a double-layer structure), and first insulating film 323 located on a side of semiconductor layer 305 is formed of, for example, a silicon oxide film that is formed by thermal oxidation. Second insulating film 325 located on a side of color filter 225 is formed of a silicon oxide film that is formed by CVD.

Light shielding film 327 is provided on a surface of first insulating film 323 and above pixel segment region 313 or below partition wall 235. Light shielding film 327, for example, has a grid pattern having openings on photodiodes PD in plan view, and is formed of, for example, a metallic film.

Also, in the fourth exemplary embodiment, a surface of second insulating film 325 has a convex shape in a manner corresponding to a concave shape of a rear surface of color filter 225.

Modification

In the first to fourth exemplary embodiments, representative aspects are described. However, the present invention is not limited to such structures and may take the following structure.

1. Wiring layer

The wiring layer has a double-layer structure in the pixel region and a triple-layer structure in the peripheral circuit region in the exemplary embodiments. However, this can be appropriately decided according to a size of the semiconductor substrate, a size of a pixel, or the like. Specifically, if there is sufficient space for wiring, the wiring layer may be arranged to have a double-layer structure both in the pixel region and the peripheral circuit region. If the size of a single pixel is small, and there is no space for wiring between the pixels, the wiring layer may be arranged to have a multilayer structure of three or more layers in the pixel region. Further, similarly, in the peripheral circuit region, a single-layer structure may be arranged only in this region if there is sufficient space for wiring.

It is noted that the wiring layer may be structured using, for example, a material or the like other than that used for the wiring layer described in the first and second exemplary embodiments.

2. Partition Wall (1) Material

The partition wall has a triple-layer structure in the first exemplary embodiment, the lower layer portion and the upper layer portion are formed of the same material in the first exemplary embodiment, and the partition wall has a double-layer structure of different materials in the second exemplary embodiment.

The partition wall can serve its purpose only if it can reflect, by the interface, penetration light before it passes through the partition wall and enters the adjacent pixel, and therefore the material thereof is not particularly restricted.

However, the partition wall should include its original function of reflecting light from a side of the color filter toward a side of the light-receiving portion, and therefore it is preferable that a material having a refraction index lower that that of the color filter be used.

A resin such as an acrylic resin, a urethane resin, an epoxy resin, a phenolic resin, a silicone resin, or even a resin including silicon oxide or the like may be used as the material for the partition wall other than the materials described in the exemplary embodiments.

(2) Interface

In the first exemplary embodiment, the upper surface (the surface on a side of the upper layer portion) of the lower layer portion is modified by plasma etching to form the modified layer, and the interface is formed between the modified layer and the upper layer portion. In the second exemplary embodiment, the lower layer portion and the upper layer portion are formed of different materials, and the interface is formed between the lower layer portion and the upper layer portion.

However, as described previously, if it is an interface that can reflect penetration light that enters the partition wall before the light passes through the partition wall and enters the adjacent pixel portion, the interface may be formed by another method.

As another method, for example, a reflection layer may be formed on an upper surface of the lower layer portion. In this case, a front surface (reflection surface) of the reflection layer corresponds to the interface between the reflection layer and the upper layer portion. For example, a metallic film, a high-refraction film, a white resin, or the like may be used to form the reflection surface (reflection layer).

Although the interface extends substantially parallel to the principal surface of the semiconductor substrate in the exemplary embodiments, it may not be parallel to the principal surface of the semiconductor substrate if it can reflect the penetration light in the partition wall. For example, even if the interface is inclined at an angle within ±5 degrees with respect to the principal surface of the semiconductor substrate, it is possible to reflect the penetration light toward a side of the microlens.

Further, in the exemplary embodiments, although the interface in cross section linearly extends in parallel to the principal surface of the semiconductor substrate, it may be bent on the way, a curved line such as an arcuate shape, or a step-like shape.

(3) Number of Layers

Although the partition wall has a triple-layer structure with the lower layer portion including the modified layer and the residual layer, and the upper layer portion in the first exemplary embodiment, and it has a double-layer structure with the lower layer portion and the upper layer portion in the second exemplary embodiment, it may be a four-layer structure or more.

For example, the partition wall may be formed of a first layer, a second layer, a third layer, a fourth layer, and an interface for reflecting the penetration light provided in a form of at least one of the interface between the first and second layers, the interface between the second and third layers, and the interface between the third and fourth layers, or alternatively two or more interfaces for reflecting the penetration light may be provided.

Alternatively, the partition wall is formed of a multi-layer structure (n-layer, where n is a natural number of 2 or larger) so that the refraction index of a layer increases as a position of the layer becomes higher. Contrary to this, it is also possible to make an arrangement so that the refraction index of a layer decreases as a position of the layer becomes higher, and the reflection surface (reflecting layer) may be provided in an intermediate layer.

(4) Shape

In the exemplary embodiments, although the partition wall has a trapezoidal shape in transverse sectional view, it may be another shape. As another cross sectional shape, it may be a rectangular shape (rectangular shape conceptually includes a square shape) or a triangular shape having a base on the side of the semiconductor substrate.

To state it differently, even if the partition wall has another cross sectional shape, it is necessary that it has the interface capable of reflecting the penetration light entering the partition wall before it passes through the partition wall and enters the adjacent pixel portion.

Further, the partitions walls have a grid pattern in plan view, and the color filters are formed in openings having a square shape. However, the opening may be in another shape, for example, a rectangular shape, a circular shape, an ellipsoidal shape, polygonal shape, or the like.

(5) Size

In the exemplary embodiments, the individual partition walls positioned between color filters have a trapezoidal shape in transverse sectional view and a same size. However, the sizes may be different from each another.

For example, even if they are in a trapezoidal shape, they may have shapes with upper and lower bases different from those of other partition walls, or shapes with heights different from those of other partition walls Further, while the partition walls are positioned between the color filters, the heights thereof may be lowered or widths thereof may be narrowed, for example, as they are located closer to the peripheral circuit region.

For example, in the exemplary embodiments, although the height of the partition wall is substantially the same as that of the color filter (in the first and second exemplary embodiments) or lower than that of the color filter (in the third exemplary embodiment), the height of the partition wall, for example, may be made larger than that of the color filter.

(6) Manufacturing Method

In the exemplary embodiments, although the partition walls are formed by utilizing the formation of the interlayer dielectric film, the pad wiring layer, or the protective film, the partition walls may be formed separately from the formation of the interlayer dielectric film, the pad wiring layer, or the protective film.

3. Solid-State Imaging Device

In the exemplary embodiments, although the solid-state imaging device is a so-called CMOS type, this may be a CCD type. Further, the light-receiving portion may be formed by sandwiching a photoelectric conversion film between upper and lower electrodes.

The present invention can be widely used for preventing color mixture in a solid-state imaging device having the partition walls provided between the color filters.

What is claimed is:

1. A solid-state imaging device comprising:
   a semiconductor substrate including a plurality of light-receiving portions formed therein;
   a wiring layer formed on the semiconductor substrate;
   color filters individually formed on the wiring layer; and
   partition walls individually formed between the color filters, wherein
   each of the partition walls includes at least two layers, and an interface positioned between the two layers and facilitating reflection of penetration light from outside, and
   the wiring layer is formed between the semiconductor substrate and the partition walls.

2. The solid-state imaging device according to claim 1, wherein a refraction index of the layer adjacent to an upper side of the interface is higher than a refraction index of the layer adjacent to a lower side of the interface.

3. The solid-state imaging device according to claim 1, wherein a material of the layer adjacent to an upper side of the interface is different from a material of the layer adjacent to a lower side of the interface.

4. The solid-state imaging device according to claim 2, wherein the layer making contact with the lower side of the interface is formed by modifying a layer of a material that is same as a material of the layer making contact with the upper side of the interface.

5. The solid-state imaging device according to claim 1, wherein the interface extends along a principal surface of the semiconductor substrate.

6. The solid-state imaging device according to claim 1, wherein the partition wall has a shape in cross section of which a width becomes smaller as distanced more from the semiconductor substrate in a vertical direction.

7. A solid-state imaging device comprising:
a semiconductor substrate including a plurality of light-receiving portions formed therein:
color filters individually formed on the light-receiving portions of the semiconductor substrate; and
partition walls individually formed between the color filters, wherein
each of the partition walls includes at least two layers, and an interface positioned between the two layers and facilitating reflection of penetration light from outside,
a wiring layer is formed on a principal surface on a side of the semiconductor substrate in which the plurality of light-receiving portions are formed,
the partition walls and the color filters are formed on a pixel region in which the plurality of light-receiving portions in the wiring layer are formed,
an insulating film, wiring for a peripheral circuit, and a protective film are sequentially formed in this order on an outer periphery of the light-receiving portions in the wiring layer, and
materials of at least the two layers of the partition walls are individually same as materials of the insulating film and the protective film.

8. A method for manufacturing a solid-state imaging device, comprising:
a partition wall forming step forming partition walls on a semiconductor substrate in which a plurality of light-receiving portions are formed and between the light-receiving portions; and;
a wiring layer forming step forming a wiring layer on the semiconductor substrate;
a filter forming step forming, on the wiring layer, color filters individually on the light receiving portions, wherein
a laminated film with at least two layers is formed in the partition wall forming step, and
the wiring layer is formed between the semiconductor substrate and the partition walls.

9. The method for manufacturing a solid-state imaging device according to claim 8, wherein, in the partition forming step, after a lower layer of the laminated film is formed, a surface of the lower layer is modified, and thereafter an upper layer of the laminated film is formed.

10. The method for manufacturing a solid-state imaging device according to claim 8, wherein, in the partition wall forming step, an upper layer of the laminated film is formed of a material having a refraction index higher than a refraction index of a lower layer of the laminated film.

* * * * *